United States Patent
Nakamura et al.

(10) Patent No.: US 10,310,046 B2
(45) Date of Patent: Jun. 4, 2019

(54) MRI APPARATUS WITH CORRECTION OF ENVELOPE OF RF PULSE

(71) Applicant: TOSHIBA MEDICAL SYSTEMS CORPORATION, Otawara-shi (JP)

(72) Inventors: Haruki Nakamura, Nasushiobara (JP); Kazuyuki Soejima, Nasushiobara (JP)

(73) Assignee: TOSHIBA MEDICAL SYSTEMS CORPORATION, Otawara-Shi (JP)

( * ) Notice: Subject to any disclaimer, the term of this patent is extended or adjusted under 35 U.S.C. 154(b) by 721 days.

(21) Appl. No.: 14/750,272

(22) Filed: Jun. 25, 2015

(65) Prior Publication Data

US 2016/0003925 A1 Jan. 7, 2016

(30) Foreign Application Priority Data

Jul. 7, 2014 (JP) ................. 2014-139533

(51) Int. Cl.
| | |
|---|---|
| *G01R 33/34* | (2006.01) |
| *G01R 33/565* | (2006.01) |
| *G01R 33/36* | (2006.01) |
| *G01R 33/28* | (2006.01) |

(52) U.S. Cl.
CPC ........ *G01R 33/5659* (2013.01); *G01R 33/288* (2013.01); *G01R 33/3614* (2013.01)

(58) Field of Classification Search
CPC ............ G01R 33/3614; G01R 33/5659; G01R 33/288; G01R 33/34092
USPC ................................. 324/300–322
See application file for complete search history.

(56) References Cited

U.S. PATENT DOCUMENTS

| 7,218,113 B2 * | 5/2007 | Feiweier | G01R 33/543 |
| | | | 324/318 |
| 8,461,842 B2 * | 6/2013 | Thuringer | H03F 1/3282 |
| | | | 324/318 |

FOREIGN PATENT DOCUMENTS

| JP | 02-305548 | | 12/1990 |
| JP | 02297338 | A * | 12/1990 |
| JP | 02305548 | A * | 12/1990 |
| JP | 4-292139 | A | 10/1992 |
| JP | 4-327834 | A | 11/1992 |
| JP | 04327834 | A * | 11/1992 |
| JP | 2010-525855 | | 7/2010 |

(Continued)

OTHER PUBLICATIONS

English translation of JP 04327834.*
Office Action dated Mar. 13, 2018 in Japanese Patent Application No. 2014-139533.

*Primary Examiner* — Jay Patidar
(74) *Attorney, Agent, or Firm* — Oblon, McClelland, Maier & Neustadt, L.L.P.

(57) ABSTRACT

According to one embodiment, an MRI apparatus includes an amplifier and processing circuitry. The amplifier amplifies an RF pulse and outputs the amplified RF pulse to an RF coil. The processing circuitry performs correction processing on an envelope of an RF pulse to be inputted to the amplifier so as to compensate nonlinear input-output characteristics of the amplifier. As to this correction processing, the processing circuitry selects a correction information item out of a plurality of correction information items prepared for a corresponding plurality of imaging conditions and performs the correction processing by using the selected information item.

11 Claims, 9 Drawing Sheets

(56) References Cited

FOREIGN PATENT DOCUMENTS

| JP | 2011-011050 | 1/2011 |
| WO | WO 2008/135872 A1 | 11/2008 |

* cited by examiner

| POWER OF REFERENCE RF SIGNAL | CORRECTED VALUE |
|---|---|
| X1 | C1 |
| X2 | C2 |
| X3 | C3 |
| ⋮ | ⋮ |
| Xn | Cn |

MRI APPARATUS WITH CORRECTION OF ENVELOPE OF RF PULSE

CROSS-REFERENCE TO RELATED APPLICATIONS

This application is based upon and claims the benefit of priority from Japanese Patent Application No. 2014-139533 filed on Jul. 7, 2014, the entire contents of which are incorporated herein by reference.

FIELD

Embodiments described herein relate generally to an MRI (Magnetic Resonance Imaging) apparatus.

BACKGROUND

An MRI apparatus is a modality necessary for medical care as of today, because it does not have a problem of exposure and can perform in-vivo examination in a less-invasive manner.

An MRI apparatus is an imaging apparatus which excites nuclear spin of an object placed in a static magnetic field with an RF (Radio Frequency) signal having the Larmor frequency and generates an image by reconstructing MR (Magnetic Resonance) signals emitted from the object due to the excitation.

Although high frequency signals (RF signals) are transmitted to an object in order to acquire the MR signals, the transmission of the high frequency signals warms up the object and increases the body temperature of the object.

Therefore, SAR (Specific Absorption Ratio) is defined as energy absorbed per unit mass of an object from the perspective of safety. Specifically, SAR (its unit is W/kg) is defined as energy of RF signal(s) absorbed in one kilogram of a living tissue, and safety reference values based on upper-limit values of SAR are defined in IEC (International Electrotechnical Commission) standard (IEC60601-2-33).

An RF signal is amplified by an amplifier so as to obtain a predetermined electric power and then transmitted to an object. This amplifier has nonlinearity and this nonlinearity becomes a factor of distortion of an outputted RF signal. As a result, it influences on setting accuracy of SAR.

BRIEF DESCRIPTION OF THE DRAWINGS

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION

Hereinbelow, a description will be given of MRI apparatus according to embodiments of the present invention with reference to the drawings.

In general, according to one embodiment, an MRI apparatus includes an amplifier and processing circuitry. The amplifier amplifies an RF pulse and outputs the amplified RF pulse to an RF coil. The processing circuitry performs correction processing on envelope of the RF pulse to be inputted to the amplifier so as to compensate nonlinear input-output characteristics of the amplifier. As to this correction processing, the processing circuitry selects a correction information item used for the correction processing out of a plurality of correction information items prepared for a corresponding plurality of imaging conditions and performs the correction processing by using the selected information item.

(Overall Configuration)

Figure 1:
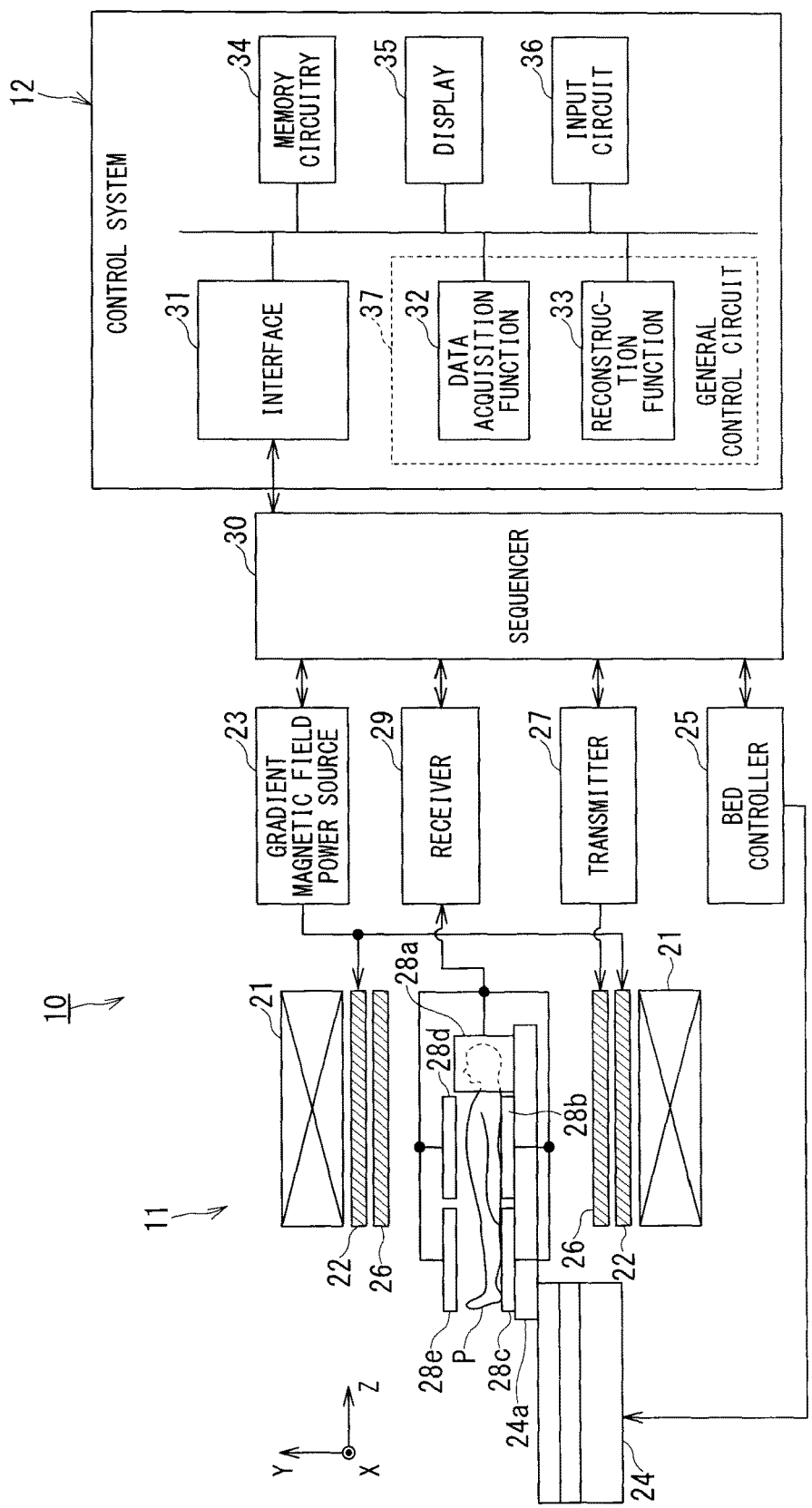
FIG. 1 is a schematic diagram showing hardware configuration of the MRI apparatus of embodiments of the present disclosure.

FIG. 1 is a schematic diagram showing hardware configuration of the MRI apparatus of embodiments of the present disclosure. The components of the MRI apparatus 10 shown in FIG. 1 can be roughly classified into an imaging system 11 and a control system 12.

The imaging system 11 includes a static magnetic field magnet 21, a gradient magnetic field coil 22, a gradient magnetic field power source 23, a bed 24, a bed controller 25, a transmission coil 26, a transmitter 27, reception coils 28a, 28b, 28c, 28d, and 28e, a receiver 29, and a sequencer (sequence controller) 30.

The static magnetic field magnet 21 is formed in a hollow cylinder shape at the outermost part of a non-illustrated gantry and generates a uniform static magnetic field magnet in its internal space. As the static magnetic field magnet 21, for example, a permanent magnet, a superconductive magnet or the like is used.

The gradient magnetic field coil 22 is formed in a hollow cylinder shape and arranged inside the static magnetic field magnet 21. The gradient magnetic field coil 22 is configured by combining three coils which respectively correspond to the mutually orthogonal X, Y, and Z axes. Each of these three coils is supplied with an electric current from the gradient magnetic field power source 23 and generates a gradient magnetic field whose magnetic field intensity varies along the X, Y, or Z axis.

Incidentally, the Z axis direction is assumed to be the same direction as the application direction of the static magnetic field. The gradient magnetic field power source 23 supplies electric currents to the gradient magnetic field coil 22, on the basis of execution data of a pulse sequence transmitted from the sequencer 30.

Here, the gradient magnetic fields generated by the gradient magnetic field coil 22 includes a readout gradient magnetic field Gr, a phase encode gradient magnetic field Ge, and a slice selection gradient magnetic field Gs. The readout gradient magnetic field Gr is used for changing frequency of an MR signal depending on a spatial position. The phase encode gradient magnetic field Ge is used for changing phase of an MR signal depending on a spatial position. The slice selection gradient magnetic field Gs is used for arbitrarily determining an imaging cross-section. For example, in the case of acquiring a slice of an axial cross-section, the sequencer 30 controls the gradient magnetic field coil 22 and gradient magnetic field power source 23 in such a manner that the X, Y, and Z axes shown in FIG. 1 respectively correspond to the readout gradient magnetic field Gr, the phase encode gradient magnetic field Ge, and the slice selection gradient magnetic field Gs.

The bed 24 includes a table 24a on which an object P is loaded. The bed inserts the table 24a with the object P loaded thereon into inside of the bore (imaging space) of the gradient magnetic field coil 22, under the control of the bed controller 25 to be described below. In general, this bed 24 is installed in such a manner that its longitudinal direction is in parallel with the central axis of the static magnetic field magnet 21.

The bed controller 25 moves the table 24a in its longitudinal direction and in the up-and-down direction, by driving the bed 24 under the control of the sequencer 30.

The transmission coil 26 is arranged inside the gradient magnetic field coil 22 and is supplied with RF (radio Frequency) signals so as to generate RF magnetic fields. The transmission coil 26 is also used as a reception coil and is also referred to as a whole body coil.

The transmitter 27 transmits an RF signal corresponding to the Larmor frequency to the transmission coil 26, on the basis of the execution data of a pulse sequence inputted from the sequencer 30. The configuration of the transmitter 27 will be described below.

The reception coils 28a to 28e are arranged inside the gradient magnetic field coil 22 and detect MR signals emitted from the object P caused by the influence of the RF magnetic fields. Here, each of the reception coils 28a to 28e is an array coil which has a plurality of coil elements configured to detect MR signals emitted from the object P. If an MR signal is detected by each coil element, each of the reception coils 28a to 28e outputs the detected MR signal toward the receiver 29.

The reception coil 28a is a coil for the head part to be mounted on the head part of the object P. In addition, the reception coils 28b and 28c are coils for the spine to be arranged between the table 24a and the back of the object P. In addition, the reception coils 28d and 28e are coils for the abdominal part to be mounted on the abdominal side of the object P. Moreover, the MRI apparatus 10 may include a dual-purpose coil which can transmit RF signals and detect MR signals.

The receiver 29 generates MR signal data on the basis of MR signals outputted from the reception coils 28a to 28e, in accordance with the execution data of a pulse sequence transmitted from the sequencer 30. In addition, the receiver 29 transmits the generated MR signal data to the control system 12 via the sequencer 30 after generating the MR signal data.

The receiver 29 has a plurality of channels for receiving MR signals outputted from the plurality of coil elements included in each of the reception coils 28a to 28e. When the information indicative of the selected coil elements used for imaging is informed from the control system 12 to the receiver 29, the receiver 29 allocates reception channels to the selected coil elements so that MR signals detected and outputted from the selected coil elements are received by the receiver 29.

The sequencer 30 is connected to the gradient magnetic field power source 23, the bed controller 25, the transmitter 27, the receiver 29, and the control system 12. The sequencer 30 includes a processor and memory circuitry, and stores control information necessary for driving the gradient magnetic field power source 23, the bed controller 25, the transmitter 27, and the receiver 29. For example, the sequencer 30 stores sequence information describing operation control information such as intensity, application period, and application timing of the pulse electric currents which should be applied to the gradient magnetic field power source 23, and so on.

In addition, the sequencer 30 moves the table 24a into and out of the gantry in the Z axis direction, by driving the bed controller 25 in accordance with the stored predetermined sequence information. Moreover, the sequencer 30 generates the X axis gradient magnetic field Gx, the Y axis gradient magnetic field Gy, the Z axis gradient magnetic field Gz, and RF signals in the gantry, by driving the gradient magnetic field power source 23, the transmitter 27, and the receiver 29 in accordance with the stored predetermined sequence information.

The control system 12 performs overall control of the MRI apparatus 10, data acquisition, image reconstruction, and so on. The control system 12 includes an interface 31, memory circuitry 34, a display 35, an input circuit 36, and a general control circuit 37 which has a data acquisition function 32 and a reconstruction function 33. The general control circuit 37 includes at least one processor, and achieves its data acquisition function 32 and reconstruction function 33 by making the processor execute programs stored in the memory circuitry 34.

The interface 31 is connected to the gradient magnetic field power source 23, the bed controller 25, the transmitter 27, and the receiver 29 of the imaging system 11 via the sequencer 30. The interface 31 controls input/output of signals transmitted and received between these respective components connected thereto and the control system 12.

The data acquisition function 32 acquires the MR signal data transmitted from the receiver 29 via the interface 31. After acquiring the MR signal data, the data acquisition function 32 stores the acquired MR signal data in the memory circuitry 34.

The reconstruction function 33 generates image data or spectrum data of intended nuclear spin inside the object P, by performing post-processing (i.e. reconstruction processing such as Fourier transformation etc.) on the MR signal data stored in the memory circuitry 34.

In addition, when imaging of scout images is performed, the reconstruction function 33 generates profile data for each coil element based on the MR signals detected by the corresponding coil element included in each of the reception coils 28a to 28e. The above profile data are data indicative of distribution of the MR signals in the alignment direction of the coil elements. Afterward, the reconstruction function 33 stores the generated various types of data in the memory circuitry 34.

The memory circuitry 34 stores the MR signal data acquired by the data acquisition function 32, the image data generated by the reconstruction function 33, etc. for each object P. The memory circuitry 34 is configured to include a storage medium, such as a magnetic or optical recording medium, typically RAMs and ROMs, or a semiconductor memory. The storage medium is readable by a processor. Part or entirety of the program and data in the storage medium may be downloaded through the electronic network.

The display 35 displays various types of information such as the image data and the spectrum data generated by the reconstruction function 33 or the like. As the display 35, a display device such as a liquid crystal display etc. can be used.

The input circuit 36 receives inputted information and various operations by an operator and outputs to the general control circuit 37 an operation input signal corresponding to the operation by the operator. As the input circuit 36, a pointing device such as a mouse, trackball, etc., a selection device such as a mode-switching switch etc., or an input device such as a keyboard etc. can be appropriately used.

The general control circuit 37 includes a processor and memory circuitry, and generally controls the MRI apparatus 10 by executing programs stored in its memory circuitry so as to control the above-mentioned respective components.

(The First Embodiment)

The MRI apparatus 10 of the first embodiment preliminarily measures nonlinear input-output characteristics of the amplifier 44, and performs correction processing on the basis of this measurement result.

In the first embodiment, a scan of acquiring data necessary for envelope correction of RF signals (RF pulses) outputted by the transmitter 27 is referred to as a calibration scan. In addition, a scan as an imaging sequence, in which data necessary for diagnosis of the object P are acquired by the MRI apparatus 10, is referred to as a main scan. Moreover, a scan, in which positioning of a data acquisition region or generation of a B1 map etc. is performed prior to the main scan, is referred to as a prescan.

(1) Configuration

Figure 2:
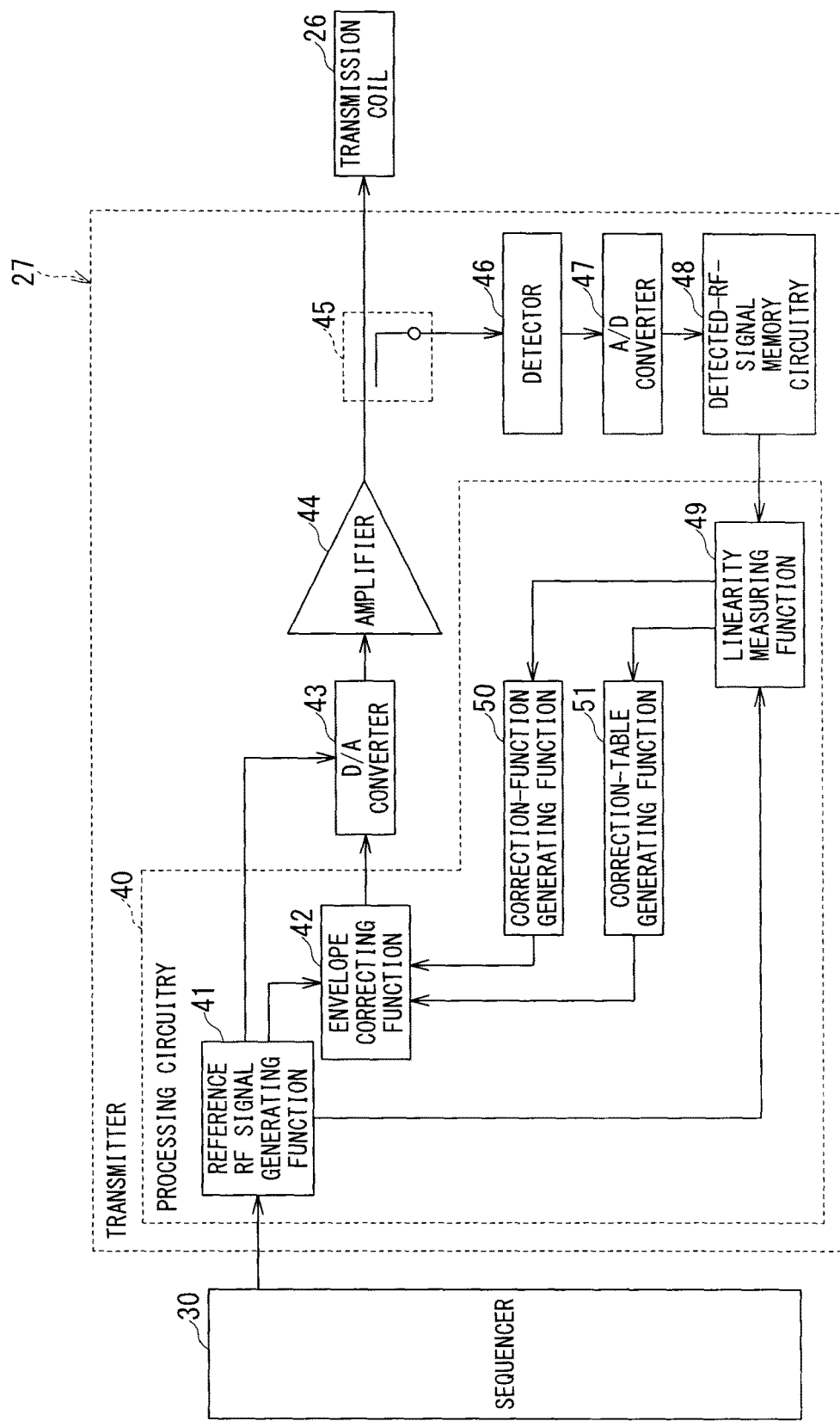
FIG. 2 is a functional block diagram showing an example of functional configuration of the MRI apparatus of the first embodiment.

FIG. 2 is a functional block diagram showing an example of the functional configuration of the MRI apparatus 10 of the first embodiment.

As shown in FIG. 2, the transmitter 27 of the MRI apparatus 10 includes processing circuitry 40 equipped with at least a processor and memory circuitry. In addition, the transmitter 27 includes a D/A (digital/analogue) converter 43, an amplifier 44, a directional coupler 45, a detector 46, an A/D (analogue/digital) converter 47, detected-RF-signal memory circuitry 48, and the processing circuitry 40 which has a reference RF signal generating function 41, an envelope correcting function 42, a linearity measuring function 49, a correction-function generating function 50, and a correction-table generating function 51.

The processing circuitry 40 functions at least as the reference RF signal generating function 41, the envelope correcting function 42, the linearity measuring function 49, the correction-function generating function 50, and the correction-table generating function 51, by making its processer executing programs stored in its memory circuitry. Each of these functions is stored in the memory circuitry in the form of program.

The reference RF signal generating function 41 is a function of generating a reference RF signal (reference RF pulse) under the control of the sequencer 30.

The reference RF signal generated by the reference RF signal generating function 41 is, for example, a signal obtained by modulating a carrier wave by a reference waveform such as a sinc function etc. When the reference waveform is a sinc function, the shape of the envelope of the reference RF signal is a sinc function.

The D/A converter 43 converts the reference RF signal, which is a digital signal, into an analogue signal.

The amplifier 44 amplifies the reference RF signal generated based on the digital signal, and outputs the amplified reference RF signal as an output-RF-signal (output-RF-pulse). The output-RF-signal is outputted to the transmission RF coil 26.

The directional coupler 45 is a high frequency device provided between the amplifier 44 and the transmission RF coil 26. The directional coupler 45 extracts the output-RF-signal outputted from the amplifier 44 to the transmission RF coil 26 by attenuating it with a required coupling degree (coupling coefficient), and supplies the extracted output-RF-signal to the detector 46.

The detector 46 detects the output-RF-signal outputted from the amplifier 44, and outputs it as a detected-RF-signal (detected-RF-pulse). The detector 46 detects signals from the directional coupler 45.

The A/D converter 47 converts the detected-RF-signal detected by the detector 46 from an analogue signal into a digital signal.

The detected-RF-signal memory circuitry 48 stores digital data of the detected-RF-signal converted in the A/D converter 47.

The envelope correcting function 42 corrects the envelope of the reference RF signal based on the difference between the reference RF signal and the detected-RF-signal, so that the envelope of the output-RF-signal outputted at the time of imaging an object matches the envelope of the reference RF signal. Hereinafter, to correct a waveform so as to make the envelope of the output-RF-signal match the envelope of the reference RF signal is referred to as envelope correction. Details of the envelope correction will be described below.

The linearity measuring function 49 measures gain linearity of the amplifier 44 from the difference between the reference RF signal and the detected-RF-signal before imaging of the object. Details of the measurement of the gain linearity will be described below.

The correction-function generating function 50 generates a correction function, which compensates the nonlinear input-output characteristics of the amplifier 44, on the basis of the gain linearity. Details of the correction function will be described below.

The correction-table generating function 51 generates a correction table, which corrects the nonlinear input-output characteristics of the amplifier 44, on the basis of the gain linearity. Details of the correction table will be described below.

(2) Operation

Next, operation of the MRI apparatus 10 of the first embodiment will be explained.

In the following explanation, a case where a calibration scan is performed as one of the procedures of a prescan will be explained as an example.

Figure 3:
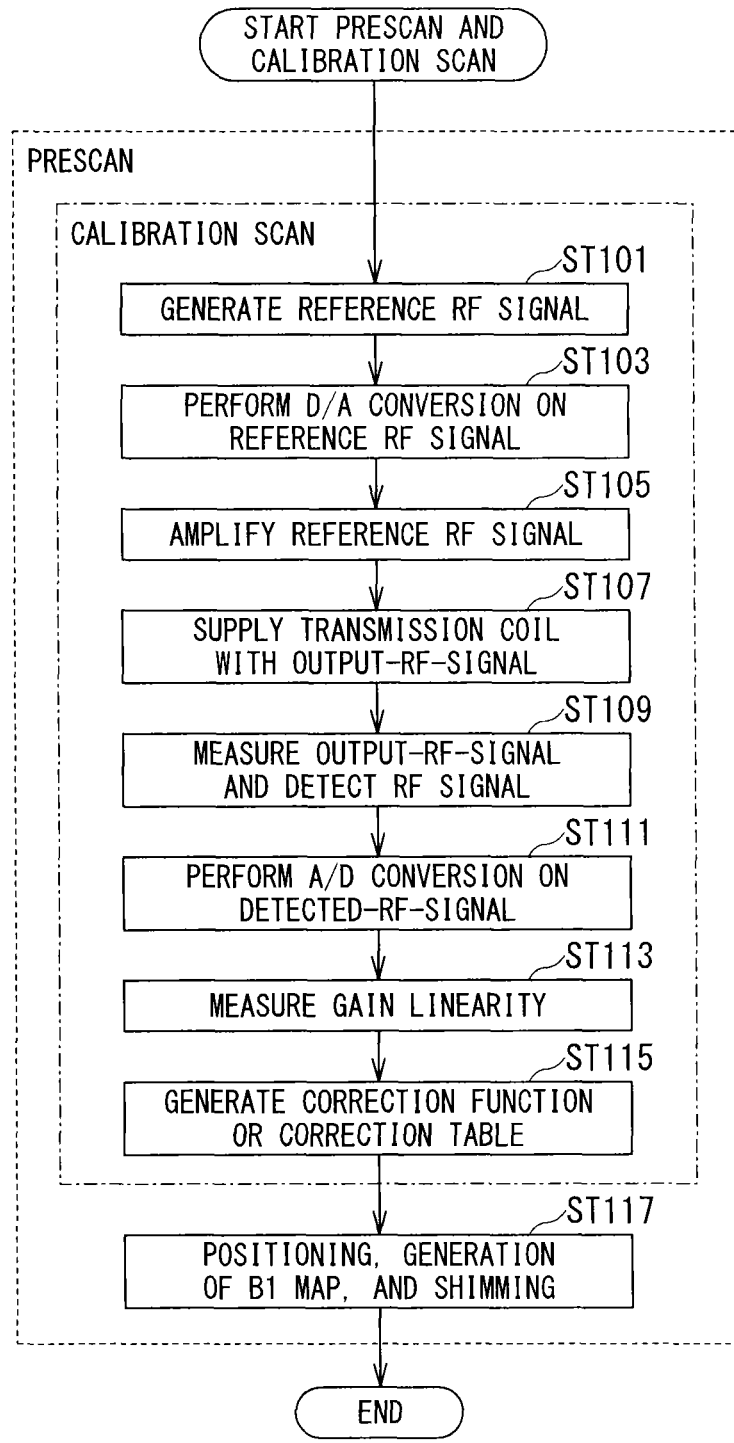
FIG. 3 is a flowchart showing an example of operation of a prescan performed by the MRI apparatus of the first embodiment.

FIG. 3 is a flowchart showing an example of operation of a prescan performed by the MRI apparatus 10 of the first embodiment. The flow chart of FIG. 3 shows an example of operation of a prescan in which a calibration scan is included as one of the procedures. The steps ST101 to ST115 show the flow chart of the calibration scan.

In the step ST101, the reference RF signal generating function 41 generates the reference RF signal. The reference RF signal generating function 41 generates the reference RF signal as a digital signal under the control of the sequencer 30.

In the step ST103, the D/A converter 43 performs D/A conversion on the reference RF signal. The originally digital reference RF signal is converted into an analogue signal by the D/A converter 43.

In the step ST105, the amplifier 44 amplifies the reference RF signal. The amplifier 44 amplifies the electric power of the reference RF signal so as to generate the output-RF-signal.

In the step ST107, the output-RF-signal is outputted from the amplifier 44 to the transmission RF coil 26, and then this output-RF-signal is transmitted from the transmission RF coil 26 to the imaging region.

In the step ST109, the detector 46 detects a signal from the directional coupler 45. The detector 46 detects the output-RF-signal inputted into the directional coupler 45, as the detected-RF-signal.

In the step ST111, the A/D converter 47 converts the detected-RF-signal as an analogue signal into a digital signal. The digitized detected-RF-signal is stored in the detected-RF-signal memory circuitry 48.

In the step ST113, the linearity measuring function 49 measures the gain linearity. The gain linearity can be calculated based on the difference in power between the reference RF signal as an input signal and the detected-RF-signal as an output signal. Additionally, the linearity measuring function 49 may measure the gain linearity by measuring the power of the output-RF-signal detected by the detector 46 at predetermined sampling intervals. Further, the reference RF signal generating function 41 may generate RF signals of various power levels and the linearity measuring function 49 may measure the gain linearity by measuring each peak power of those RF signals.

Figure 4A:
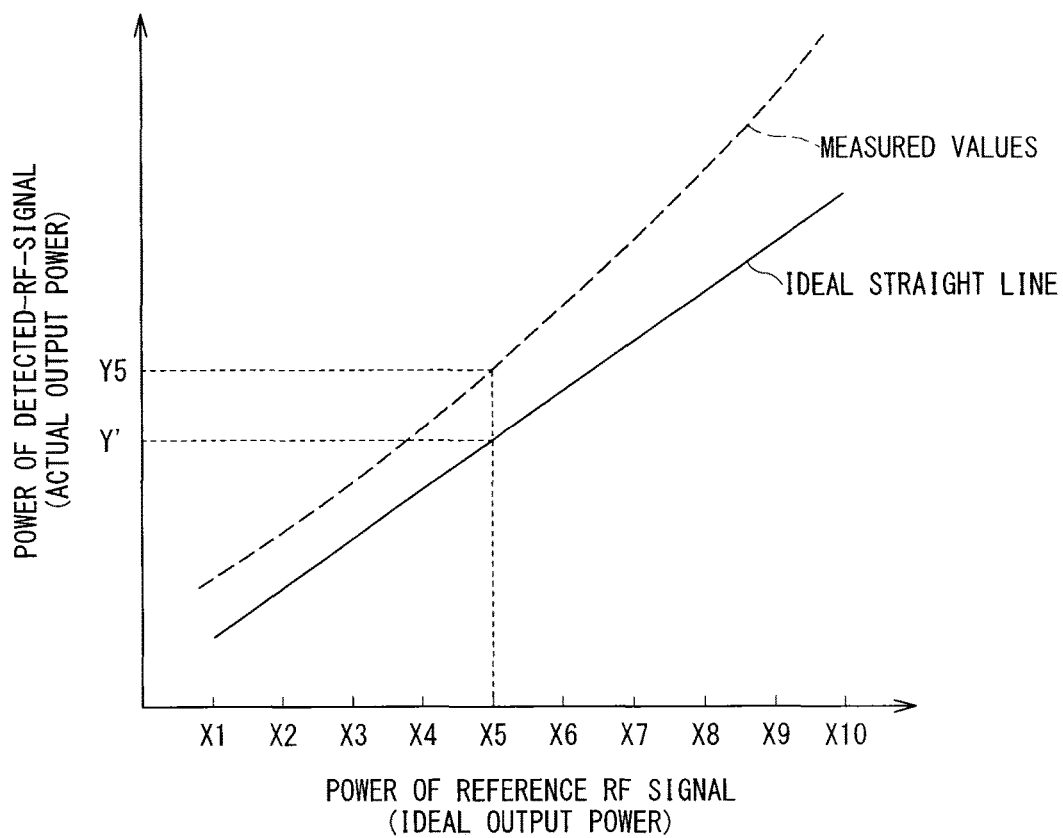
FIG. 4A is a schematic chart showing an example of a result of gain linearity measurement of RF signals.
Figure 4B:
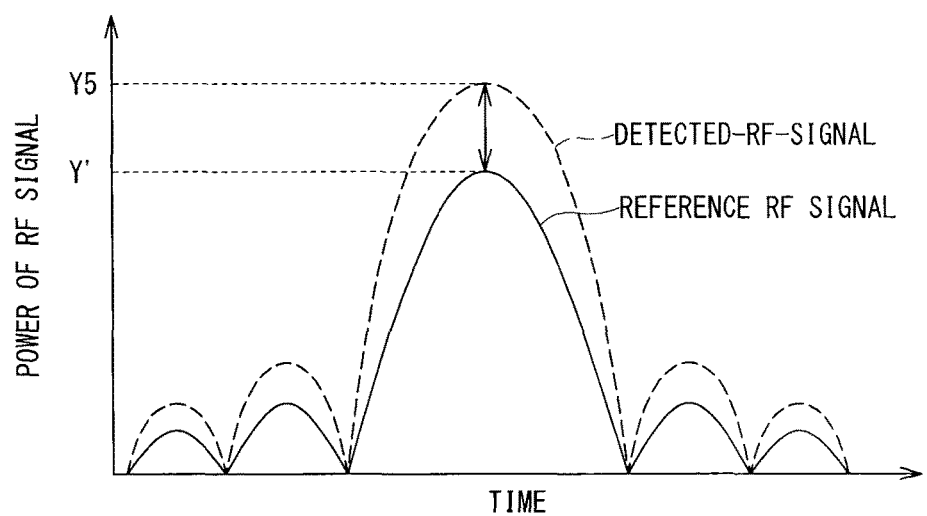
FIG. 4B is a schematic chart showing an example of a method of correcting RF signals.

FIG. 4A and FIG. 4B are charts explaining an example of gain linearity of an RF signal and an example of a correction method. FIG. 4A shows an example of a result of gain linearity measurement of an RF signal. Gain linearity is an index which indicates performance of the amplifier 44 by the difference between the actually outputted power and the required ideal output power.

In FIG. 4A, the vertical axis indicates power of the detected-RF-signal (i.e. actually outputted power) and the horizontal axis indicates the setting value of power of the reference RF signal (i.e. ideal output power). In FIG. 4A, the broken line indicates linearity obtained from the measurement of the detected-RF-signal while changing the setting value for the reference RF signal.

In the example of FIG. 4A, an ideal case where the actually outputted power matches the ideal output power is indicated by the solid straight line. It is clear from FIG. 4A that the detected-RF-signal detected after being amplified by the amplifier 44 has power different from the ideal power. For example, consider a case where the power X5 of the reference RF signal in FIG. 4A is inputted. In this case, the power Y' is detected if the power of the detected-RF-signal is ideal. However, the actually measured power of the detected-RF-signal is Y5.

As explained above, a gap is generated between the ideal output power and the actually outputted power, and the gap is nonlinear and different depending on magnitude of power inputted into the amplifier 44 etc. This nonlinearity is mainly caused by characteristics of the amplifier 44. The nonlinearity of the amplifier 44 is a factor of influencing setting accuracy of SAR and image quality by causing a gap between the actually outputted power of an RF signal and its required (ideal) output power.

For the above reasons, correction processing of suppressing influence of the nonlinearity of the amplifier 44 by correcting peak power of an RF signal inputted into the amplifier 44 in consideration of its nonlinearity has been performed in a conventional MRI apparatus.

FIG. 4B shows an example of a method of correcting RF signals. In the graph of FIG. 4B, the vertical axis indicates power of an RF signal and the horizontal axis indicates time. The solid line indicates the reference RF signal whose peak power is Y' in FIG. 4A, and the broken line indicates a detected-RF-signal whose peak power is Y5 in FIG. 4A.

For example, there is a correction method in which the peak power of this detected-RF-signal is corrected so as to match the ideal power. In other words, there is a correction method in which the peak power of the preliminarily inputted reference RF signal is corrected to become smaller so as not to generate the difference shown by the bidirectional arrow in FIG. 4B between the peak power Y5 of the detected-RF-signal and the peak power Y' of the reference RF signal.

However, even if the correction processing is performed by using the peak power value as an example, a satisfactory effect of correction cannot be obtained as to the power values except the peak power value in some cases. This is because the nonlinearity of the amplifier 44 shows different characteristics depending on power level of each RF signal.

For example, in the case of partially performing correction processing aimed at the peak power like FIG. 4B, power levels except the peak power level are uniformly subjected to this correction processing. In this case, appropriate correction is achieved as to the power level at the timing of the correction target, whereas output power level excessively increases or decreases at some timings. Thus, by performing such uniform correction processing, influence of the amplifier 44 partially remains (or too heavily remains) in some cases, which makes the envelope shape of the detected-RF-signal different from that of the reference RF signal.

Figure 5:
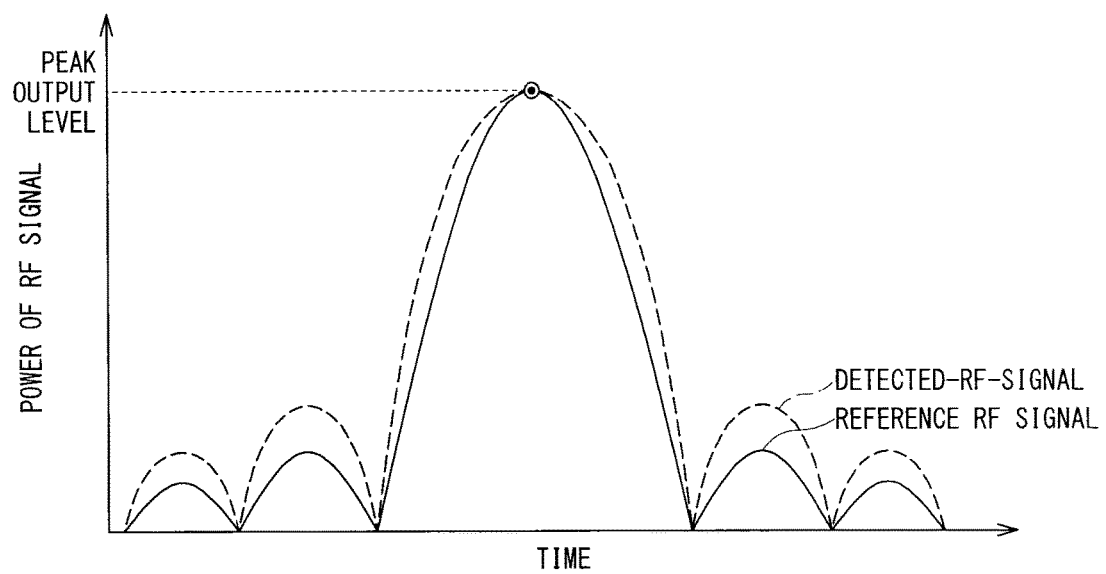
FIG. 5 is a schematic chart showing a difference in envelope between a reference RF signal and a detected-RF-signal.

FIG. 5 is a schematic chart explaining a difference in envelope between the reference RF signal and the detected-RF-signal. The broken line in FIG. 5 indicates the detected-RF-signal subjected to the correction processing in which only the peak power is corrected by the method shown in FIG. 4B. The solid line in FIG. 5 indicates the reference RF signal. Even if correction processing is performed so that the detected-RF-signal matches the reference RF signal in peak power level, the envelope of an RF signal cannot be sufficiently corrected. This is because a different power of the inputted reference RF signal causes different gain of the amplifier 44. Thus, except the peak power, an RF signal is outputted with a power value different from the required power value due to the nonlinearity of the amplifier 44.

In the example of FIG. 5, though the detected-RF-signal shown by the broken line approximately matches the reference RF signal shown by the solid line in the peak power value, the power of the detected-RF-signal is higher than the power of the reference RF signal at all times except the time of the peak power. In other words, the envelope of the outputted RF signal is different from the envelope of the ideal RF signal.

SAR is different depending not only on the peak value of an RF signal but also on the envelope shape of an RF signal. Thus, when the envelope of the actually outputted RF signal is different from that of the ideal RF signal, the estimated SAR becomes different from the actual SAR. In such a case, SAR not smaller than a reference value is set or SAR having excessive gap with respect to the reference value is set. As explained above, when the envelope of the actually outputted RF signal is different from that of the ideal RF signal, it influences on setting accuracy of SAR.

Meanwhile, shape of an RF signal subjected to Fourier transformation in a frequency space influences slice shape and slice thickness. These slice shape and slice thickness are referred to as a slice profile. The ideal slice profile is a rectangle. In order to obtain the rectangular slice profile, an RF signal whose envelope shape is in the form of a sinc function is transmitted in general.

However, if a waveform of an RF signal is distorted due to the above-mentioned nonlinearity of an amplifier, the envelope shape of this RF signal deviates from the sinc function being set. As a result, the slice profile is sometimes distorted. Such distortion of the slice profile becomes a factor of artifact in an MRI image called crosstalk.

For the above reasons, the MRI apparatus 10 of the present embodiment enhances setting accuracy of SAR and suppresses influence on the slice profile etc., by performing envelope correction which targets and adjusts the entire envelope of an RF signal as a whole such that the entire envelope of an RF signal matches the entire envelope of the ideal RF signal.

Returning to the flow chart in FIG. 3, the method of the envelope correction processing will be explained. First, in order to perform the envelope correction processing, a correction function or a correction table is preliminarily generated in the calibration scan executed as one of the procedures of the prescan.

In the step ST115, the correction-function generating function 50 calculates the correction function. Alternatively, the correction-table generating function 51 generates the correction table.

In the step ST117, positioning, generation of a B1 map, shimming, etc. which are generally executed in the prescan are executed.

Figures 6, 7:
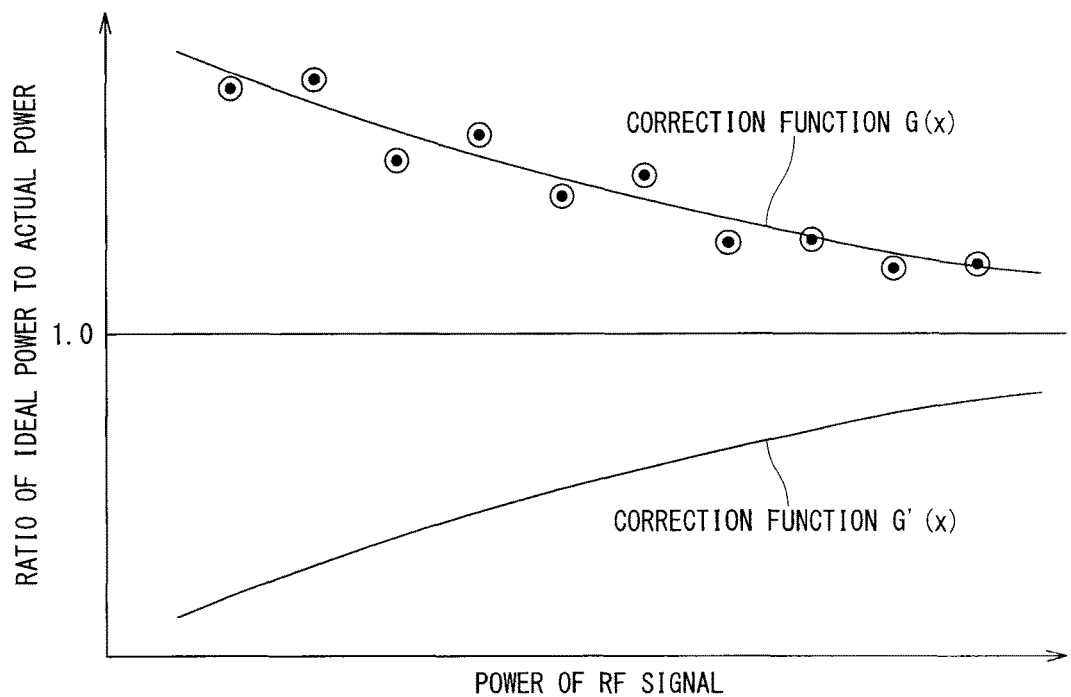
FIG. 6 is a schematic chart explaining a correction function used by the MRI apparatus of the first embodiment.
FIG. 7 is a schematic chart explaining a correction table used by the MRI apparatus of the first embodiment.

FIG. 6 is a schematic chart showing correction functions of the MRI apparatus 10 of the first embodiment. In FIG. 6, the vertical axis indicates the ratio of the ideal power to the actual power, and the horizontal axis indicates power of an RF signal. FIG. 6 illustrates a graph in which the ratio of the ideal power to the actual power is plotted for a plurality of power values of an RF signal based on values of gain linearity measured by the linearity measuring function 49. The ratio of the ideal power to the actual power is, for example, the ratio of the power of reference RF signal to the power of the detected-RF-signal.

FIG. 6 illustrates an example in which the correction function is derived by calculating an approximate curve based on the ratio of the ideal power to the actual power. G' (x) shown at the lower part of FIG. 6 is a graph of the reciprocal of G(x) shown at the upper part of FIG. 6. For example, by multiplying the function of the reference RF signal by G' (x), the entire envelope of the outputted RF signal can be corrected.

Here, the function of the reference RF signal before the correction processing is defined as Y(t), and the function of the reference RF signal already applied with the correction processing is defined as F(t). Then, F(t) can be calculated by the following equation (1).

$$F(t)=Y(t)/G[f(t)] \quad (1)$$

In addition, the envelope correction can be also performed on the basis of correction table, instead of the correction function.

FIG. 7 is a chart explaining the correction table used by the MRI apparatus 10 of the first embodiment. In the correction table shown in FIG. 7, the power values of the reference RF signal are illustrated in the left column and the correction values corresponding respectively to the power values in the left column are illustrated in the right column. Each correction value may be the ratio of the reference RF signal to the detected-RF-signal which can be calculated based on the linearity measured by the linearity measuring function 49. Alternatively, each correction value may be the difference between the reference RF signal and the detected-RF-signal or a gain for actually correcting power of an RF signal.

In addition, the correction table may be a look-up table in which the calculation result of the above-mentioned equation (1) is summarized. As shown in FIG. 7, the correction table may include correction values associated with respective RF power values. Thus, the envelope correction based on the correction table is performed by correcting the reference RF signal at each power value.

Figure 8:
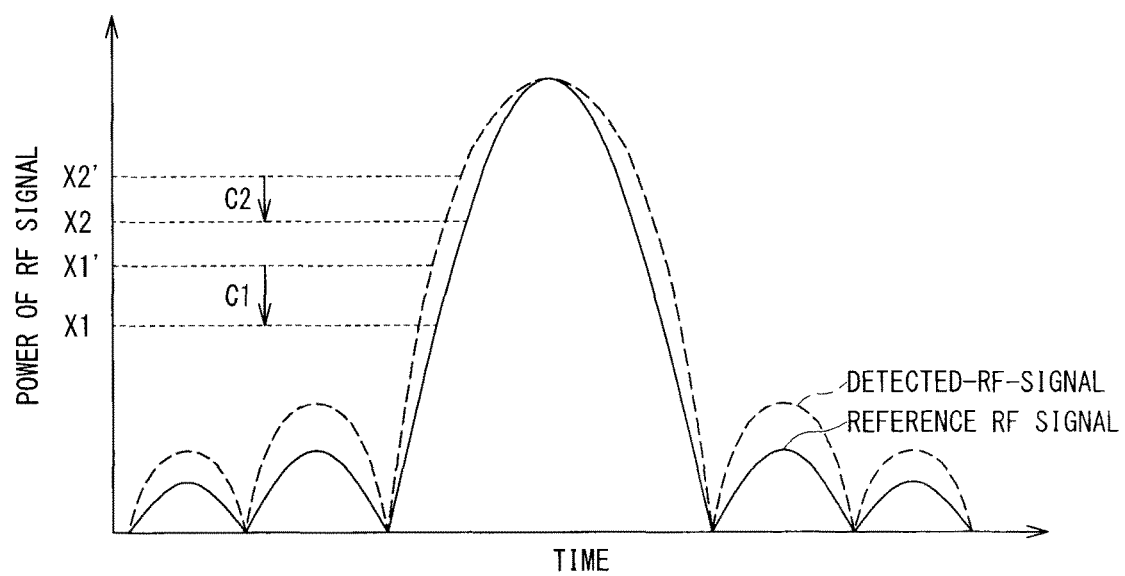
FIG. 8 is a schematic chart showing a correction method with the use of the correction table performed by the MRI apparatus of the first embodiment.

FIG. 8 is a schematic chart showing a correction method with the use of the correction table performed by the MRI apparatus 10 of the first embodiment. In FIG. 8, the solid line indicates the reference RF signal, and the broken line indicates the detected-RF-signal subjected to the conventional correction processing in which only the peak power is corrected. In the case of correcting this RF signal, the correction values for the respective RF power values illustrated in the correction table of FIG. 7 are used. In FIG. 8, the solid curve line indicates power of the reference RF signal and the broken curve line indicates power of the detected-RF-signal. As an example here, it is assumed that the value X1' is measured as the power of the detected-RF-signal in the case of inputting the value X1 as the power of the reference RF signal.

In order to actually output the power value X1, the outputted RF signal can be brought close to the ideal power by acquiring the correction value C1 from the correction table shown in FIG. 7 and correcting the reference RF signal by the correction value C1. The same correction is performed on the power value X2 of the reference RF signal. As mentioned above, the entire envelope can be corrected by correcting a plurality of power values in a stepwise manner. In addition, the envelope of an RF signal can be more smoothly corrected by correcting its power values at smaller intervals.

By preliminarily calculating and preparing such a correction function or correction table, an RF signal can be transmitted toward the object P with required waveform and power. For example, when the object P is imaged for positioning and generation of a B1 map to be performed in a prescan, an ideal RF signal can be transmitted and thus more precise information can be obtained.

Hereinafter, operation of the main scan with the use of the above-mentioned correction method will be explained.

Figure 9:
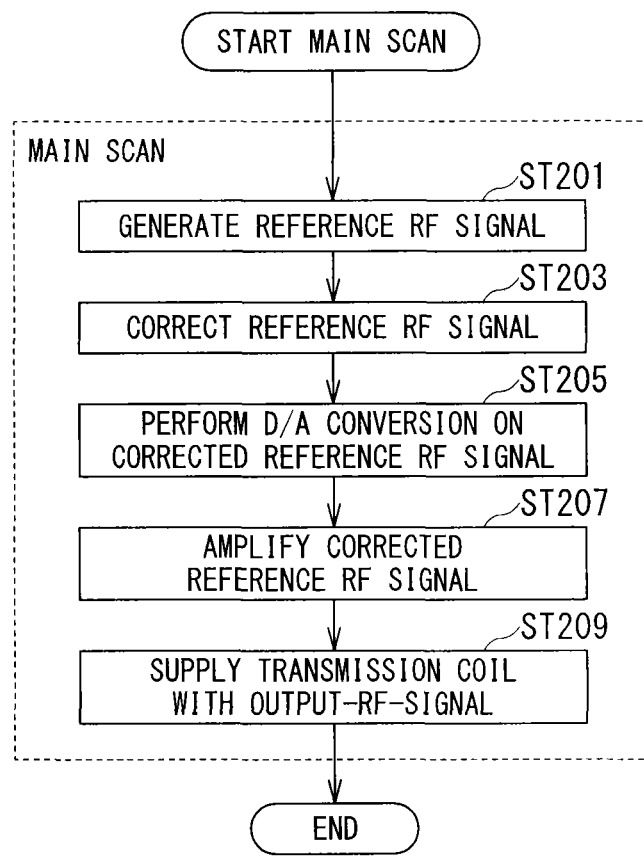
FIG. 9 is a flowchart showing an example of operation of a main scan performed by the MRI apparatus of the first embodiment.

FIG. 9 is a flowchart showing an example of operation of the main scan performed by the MRI apparatus 10 of the first embodiment.

In the step ST201, the reference RF signal generating function 41 generates the reference RF signal.

In the step ST203, the envelope correcting function 42 corrects the envelope of the reference RF signal to be inputted to the amplifier 44 by performing digital processing. As to the method of the envelope correction, any one of the correction function and the correction table can be used.

In the step ST205, the D/A converter 43 performs D/A conversion on the reference RF signal which has been subjected to the envelope correction. The digital reference RF signal after being subjected to the envelope correction is converted into analogue signal by the D/A converter 43.

In the step ST207, the amplifier 44 amplifies the reference RF signal having been subjected to the envelope correction and generates the output-RF-signal.

In the step ST209, the output-RF-signal is outputted from the amplifier 44 to the transmission RF coil 26, and the output-RF-signal is transmitted from the transmission RF coil 26 to the imaging region.

The output-RF-signal is thus corrected so that its envelope approximately matches the envelope of the required reference RF signal based on the preliminarily calculated correction function or correction table, and then the corrected output-RF-signal is transmitted to the imaging region.

Because an RF signal having intended waveform and power can be transmitted by the envelope correction, setting accuracy of SAR is improved and thus control of SAR based on safety reference values can be precisely performed in the main scan etc.

In addition, because an imaging slice can be set based on the slice profile that matches the intended slice profile, an image of desired slice shape and slice thickness can be obtained. Moreover, because the slice profile can be more precisely acquired, an appropriate slice interval whereby crosstalk is avoided can be set.

Incidentally, an example in which a calibration scan for generating the correction function or the correction table is performed as one of the procedures of a prescan has been explained in the first embodiment. However, such a calibration scan may be performed at the time of installation of the MRI apparatus 10. In addition, when a plurality of sequences is performed in the main scan, the calibration scan may be performed between the sequences. Moreover, the calibration scan may be performed at a predetermined time such as before or after using the MRI apparatus 10 in a day (for example, during inspection period before start of operation in a day, or during inspection period after completing the operation in a day). Additionally, the calibration scan may be performed at the time of a periodic maintenance check so as to periodically update the correction function and the correction table.

Further, an output interval of RF signals becomes long or short in some cases depending on the type of sequence. Especially in the case of a short output interval, the nonlinearity of the amplifier 44 variously changes in some cases. This is because the nonlinear input-output characteristics of the amplifier 44 changes depending on imaging conditions such as average electric power (power duty) of an inputted RF pulse train etc.

For the above reasons, it is preferable that the processing circuitry 40 should preliminarily generate correction information items (such as the correction function and/or the correction table) for each of the imaging conditions. As the imaging conditions, the type of pulse sequence, the output interval of an RF pulse train defined in a pulse sequence, etc. are included in addition to the average electric power of the RF pulse train defined in a pulse sequence.

As a concrete example, in a sequence whose output interval of RF pulses is short like an FSE (Fast Spin Echo) technique, more accurate correction can be performed by using the correction function and/or the correction table generated by measuring gain linearity after actually outputting RF signals at short output intervals.

In addition, a calibration scan, in which various RF pulse trains with mutually different average electric power values are outputted and gain linearity is measured, may be performed such that the average electric power values are classified into plural groups and the correction function or correction table is generated for each group. As an example in this case, the average electric power may be classified into three groups: (a) power duty is 0-500 W (for example, 500 W or less), (b) power duty is 500-100 W, and (c) power duty is 1000 W—(for example, more than 1000 W). Moreover, because the average electric power of an RF pulse train is different depending on the type of pulse sequence, a dedicated correction function and/or a dedicated correction table may be generated in the calibration scan for each pulse sequence.

When the correction information item (correction function and/or correction table) is preliminarily generated for each of the imaging conditions, the sequencer 30 supplies the processing circuitry 40 with waveform information of RF pulses and information on the imaging conditions. In this case, the processing circuitry 40 selects the correction information item corresponding to the information on the imaging conditions supplied from the sequencer 30, out of a plurality of preliminarily stored correction information items. Then, the processing circuitry 40 can use the selected correction information item when applies the envelope correction to the reference RF pulses to be inputted into the amplifier 44.

(The Second Embodiment)

The MRI apparatus 10 of the second embodiment corrects the nonlinearity of the amplifier 44 by performing feedback control on a real-time basis.

(1) Configuration

Figure 10:
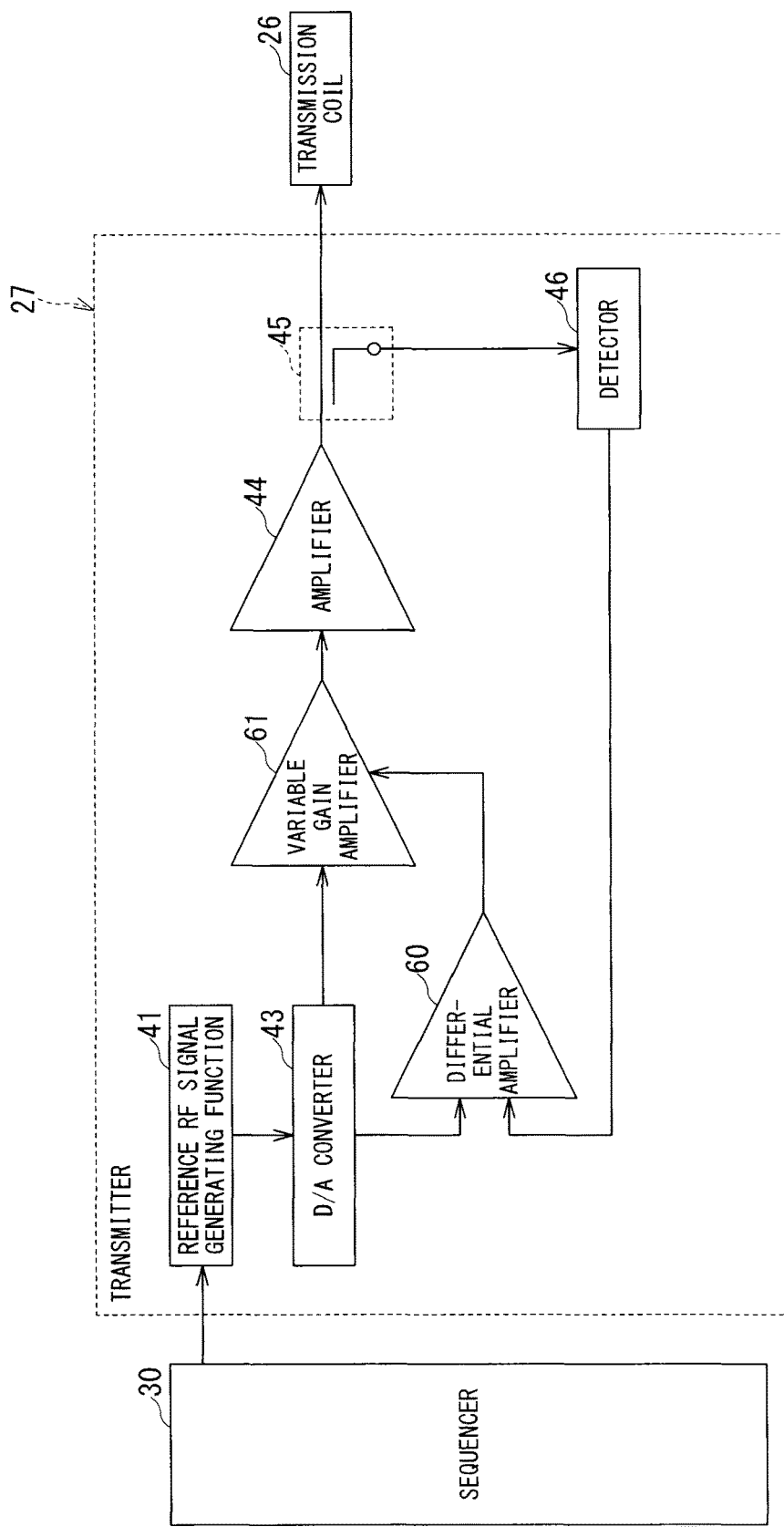
FIG. 10 is a functional block diagram showing an example of functional configuration of the MRI apparatus of the second embodiment.

FIG. 10 is a functional block diagram showing an example of functional configuration of the MRI apparatus 10 of the second embodiment. The same reference numbers are given for the same components as the first embodiment in FIG. 10, and duplicate explanation is omitted.

As shown in FIG. 10, the transmitter 27 of the MRI apparatus 10 includes a differential amplifier 60 and a variable gain amplifier 61.

The differential amplifier 60 calculates the difference in envelope between the reference RF signal and the detected-RF-signal. The difference outputted from the differential amplifier 60 reflects not only the difference in peak but also the difference in envelope shape.

The variable gain amplifier 61 corrects the envelope of the reference RF signal by changing a gain with respect to the reference RF signal based on the difference outputted from the differential amplifier 60, so that the envelope of the output-RF-signal matches the envelope of the reference RF signal.

(2) Operation

Hereinafter, operation of correcting envelope with the use of an analogue circuit in the MRI apparatus 10 of the second embodiment will be explained.

First, the reference RF signal generating function 41 generates the reference RF signal. The reference RF signal is converted into an analogue signal by the D/A converter 43, and the amplifier 44 amplifies the reference RF signal so as to generate the output-RF-signal. The amplified output-RF-signal is transmitted from the transmission RF coil 26 to the object P.

The output-RF-signal transmitted to the transmission RF coil 26 is detected by the detector 46. Then, the differential amplifier 60 compares the power between the reference RF signal and the detected-RF-signal detected by the detector 46, and outputs the difference in power between the reference RF signal and the detected-RF-signal based on the above comparison result.

Next, the variable gain amplifier 61 changes the gain of the reference RF signal, on the basis of the difference between the reference RF signal and the detected-RF-signal calculated by the differential amplifier 60. In other words, the variable gain amplifier 61 adjusts the gain so that the detected-RF-signal and the reference RF signal match each other. As explained above, RF power actually outputted from the amplifier 44 can be brought close to required power, by performing correction processing of RF power reflecting the nonlinearity of the amplifier 44 before being outputted from the amplifier 44.

Finally, the amplifier 44 generates the output-RF-signal by amplifying the modulated RF signal having been subjected to the above correction processing. The corrected output-RF-signal is transmitted from the transmission RF coil 26 to the object P. This output-RF-signal is detected by the detector 46, then the differential amplifier 60 outputs the difference in power between the detected-RF-signal and the reference RF signal, then the variable gain amplifier 61 adjusts the gain based on the difference, and accordingly the envelope correction is achieved under such feedback control.

As mentioned above, the waveform amplified by the amplifier 44 is controlled so as to approximately match the waveform of the reference RF signal under the feedback control in the second embodiment. Thereby, the envelope of an RF signal actually transmitted to the object P can be brought close to the required envelope shape. In addition, correction can be performed on a real-time basis in the second embodiment. Therefore, even if power of the outputted RF signal fluctuates due to change in gain and successive change in input-output characteristics caused by heat of the amplifier 44 as an example, envelope of an RF signal can be appropriately corrected so as to follow such change according to the second embodiment.

According to the MRI apparatus of at least one of the above-mentioned embodiments, output of an RF signal can be appropriately controlled.

Incidentally, the processing circuitry 40 in the first embodiment is an example of the processing circuitry in the claims. In addition, the term "processor" regarding the processing circuitry 40 of the transmitter 27, the sequencer 30, and the general control circuit 37 means, for instance, a circuit such as a dedicated or general-purpose CPU (Central Processing Unit), a dedicated or general-purpose GPU (Graphics Processing Unit), an ASIC (Application Specific Integrated Circuit), a programmable logic device including SPLD (Simple Programmable Logic Device) and CPLD (Complex Programmable Logic Device) as examples, an FPGA (Field Programmable Gate Array), and so on. A processor achieves various types of functions by reading out programs stored in memory circuitry and implementing the programs.

In addition, programs may be directly installed in the circuit of a processor instead of storing programs in the memory circuitry. In this case, the processor achieves various types of functions by reading out programs stored in its own circuit and implementing the programs.

Although a case where the unified processing circuitry 40 achieves each function has been explained above, this is only an example. As another example, the processing circuitry 40 may be configured by combining a plurality of mutually independent processors so that each function is achieved by each processer that executes the corresponding program.

In addition, when a plurality of processors are used, a memory medium for storing programs may be disposed for each processer, or a single memory circuit may collectively store the programs corresponding to the functions of all the processors.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. An MRI apparatus, comprising:
an amplifier configured to amplify an RF pulse and output an amplified RF pulse to an RF coil; and
processing circuitry configured to perform correction processing on an envelope of an RF pulse to be inputted to the amplifier so as to compensate for nonlinear input-output characteristics of the amplifier,
wherein the processing circuitry is further configured to
select a correction information item out of a plurality of correction information items prepared for a corresponding plurality of imaging conditions, and
perform the correction processing on the envelope of the RF pulse by using the selected correction information item: and
wherein each of the imaging conditions is an average electric power of an RF pulse train defined in a pulse sequence.

2. The MRI apparatus according to claim 1,
wherein the processing circuitry is further configured to acquire waveform information of the RF pulse and information on an imaging condition from a sequencer, and to select the correction information item based on the waveform information of the RF pulse and the information on the imaging condition.

3. The MRI apparatus according to claim 1,
wherein the processing circuitry is further configured to generate the plurality of correction information items at, at least one of, a time when the MRI apparatus is installed, a time when a prescan is executed prior to imaging of an object, and a time immediately before start of a pulse sequence of imaging the object.

4. An MRI apparatus, comprising:
an amplifier configured to amplify an RF pulse and output an amplified RF pulse to an RF coil;
processing circuitry configured to perform correction processing on an envelope of an RF pulse to be inputted to the amplifier so as to compensate for nonlinear input-output characteristics of the amplifier; and
a detector configured to detect an amplified RF pulse outputted from the amplifier and to output a detected pulse as a detection RF pulse, wherein
the amplifier is configured to receive a reference RF pulse generated based on a digital signal and to output the amplified RF pulse as an output RF pulse to the RF coil by amplifying the reference RF pulse, and
the processing circuitry is further configured to
select a correction information item out of a plurality of correction information items prepared for a corresponding plurality of imaging conditions, and
perform correction processing by using the selected information item on an envelope of the reference RF pulse to be inputted to the amplifier such that an envelope of the output RF pulse outputted at a time of imaging an object matches the envelope of the reference RF pulse.

5. The MRI apparatus according to claim 4,
wherein the processing circuitry is further configured to measure gain linearity of the amplifier based on a difference between the reference RF pulse and the detection RF pulse before the time of imaging the object, and
each of the plurality of correction information items is generated based on the gain linearity.

6. The MRI apparatus according to claim 5,
wherein the processing circuitry is further configured to
generate a plurality of correction functions, as the plurality of correction information items, based on the gain linearity, which is different between the plurality of imaging conditions, to compensate for the nonlinear input-output characteristics of the amplifier for the corresponding plurality of imaging conditions,
select a correction function used for the correction processing, and
apply the correction processing to the reference RF pulse by using the selected correction function.

7. The MRI apparatus according to claim 6,
wherein the processing circuitry is further configured to generate the plurality of correction functions, which are mutually different, according to an average electric power of an RF pulse train defined in a pulse sequence.

8. The MRI apparatus according to claim 6,
wherein the processing circuitry is further configured to generate the plurality of correction functions, which are mutually different, according to a type of pulse sequence.

9. The MRI apparatus according to claim 5,
wherein the processing circuitry is further configured to
generate a plurality of correction tables, as the plurality of correction information items, based on the gain linearity, which is different between the plurality of imaging conditions, to compensate for the nonlinear input-output characteristics of the amplifier for the corresponding plurality of imaging conditions,
select a correction table used for the correction processing, and
apply the correction processing to the reference RF pulse by using the selected correction table.

10. The MRI apparatus according to claim 9,
wherein the processing circuitry is further configured to generate the plurality of correction tables, which are mutually different, according to an average electric power of an RF pulse train defined in a pulse sequence.

11. The MRI apparatus according to claim 9,
wherein the processing circuitry is further configured to generate the plurality of correction tables, which are mutually different, according to a type of pulse sequence.

* * * * *